(12) United States Patent
Rapp

(10) Patent No.: US 10,775,318 B2
(45) Date of Patent: Sep. 15, 2020

(54) SYSTEM AND METHOD FOR DETECTING A LEVEL OF DIRTINESS OF A FILTER MAT OF AN AIRFLOW COOLING SYSTEM FOR TELECOMMUNICATIONS EQUIPMENT

(71) Applicant: Xieon Networks S.à.r.l., Luxembourg (LU)

(72) Inventor: Lutz Rapp, Deisenhofen (DE)

(73) Assignee: XIEON NETWORKS S.a.r.l., Luxembourg (LU)

( * ) Notice: Subject to any disclaimer, the term of this patent is extended or adjusted under 35 U.S.C. 154(b) by 0 days.

(21) Appl. No.: 16/092,825

(22) PCT Filed: Jun. 1, 2017

(86) PCT No.: PCT/EP2017/063370
§ 371 (c)(1),
(2) Date: Oct. 11, 2018

(87) PCT Pub. No.: WO2017/215942
PCT Pub. Date: Dec. 21, 2017

(65) Prior Publication Data
US 2019/0128820 A1  May 2, 2019

(30) Foreign Application Priority Data

Jun. 14, 2016 (EP) .................................... 16174335

(51) Int. Cl.
*G01N 21/94* (2006.01)
*B01D 46/00* (2006.01)
(Continued)

(52) U.S. Cl.
CPC .......... *G01N 21/94* (2013.01); *B01D 46/0086* (2013.01); *G01N 21/956* (2013.01);
(Continued)

(58) Field of Classification Search
CPC ............ G01N 21/94; G01N 21/95607; B01D 46/0086; H05K 7/20181; H05K 7/20563
(Continued)

(56) References Cited

U.S. PATENT DOCUMENTS 4,405,342 A   9/1983  Bergman
5,141,309 A * 8/1992  Worwag .................... A47L 9/19
                                                                356/72
(Continued)

FOREIGN PATENT DOCUMENTS

DE   15 07 818 A1   3/1972
DE   37 22 693 C1   5/1988
(Continued)

OTHER PUBLICATIONS

International Search Report and Written Opinion, PCT/EP2017/063370, dated Aug. 30, 2017, 15 pages.

*Primary Examiner* — Roy M Punnoose

(57) ABSTRACT

A system (10) for detecting a level of dirtiness of a filter mat (20) of an airflow cooling system for telecommunications equipment, the system (10) comprising a detector (12) for detecting fluorescent or reflected light backscattered at at least one part in (22) of the filter mat (20) comprising or treated with a fluorescent or reflective material, wherein the detector (12) comprises a light source (12a) for illuminating said at least one part (22) of the filter mat (20) with sampling light, and a photosensor (12b) for detecting fluorescent or reflected light backscattered at said at least one part (22) of the filter mat (20) caused by the illumination thereof with sampling light, wherein the system (10) is configured for inferring the level of dirtiness of the filter mat (20) from the amount of detected fluorescent or reflected light.

24 Claims, 7 Drawing Sheets

(51) Int. Cl.
*H05K 7/20* (2006.01)
*G01N 21/956* (2006.01)

(52) U.S. Cl.
CPC . *G01N 21/95607* (2013.01); *G01N 21/95692* (2013.01); *H05K 7/20181* (2013.01); *H05K 7/20563* (2013.01); *B01D 2273/18* (2013.01); *B01D 2273/26* (2013.01)

(58) Field of Classification Search
USPC .................................................... 356/237.1
See application file for complete search history.

(56) References Cited

U.S. PATENT DOCUMENTS

| | | | | |
|---|---|---|---|---|
| 5,828,460 | A * | 10/1998 | Lucovsky | G01N 21/474 356/446 |
| 7,012,685 | B1 * | 3/2006 | Wilson | B01D 46/0086 356/239.1 |
| 8,207,508 | B2 * | 6/2012 | Lawless | G01N 21/05 250/301 |
| 8,744,780 | B2 * | 6/2014 | Wilson, Jr. | G01N 21/59 356/239.1 |
| 9,937,453 | B2 * | 4/2018 | Baek | F24F 3/1603 |
| 10,345,216 | B2 * | 7/2019 | Clayton | G01N 15/0625 |
| 2005/0061155 | A1 * | 3/2005 | Franey | B01D 46/0086 96/421 |
| 2006/0100796 | A1 * | 5/2006 | Fraden | A47L 9/19 702/45 |
| 2009/0223635 | A1 * | 9/2009 | Lawless | G01N 21/05 156/380.9 |
| 2010/0097233 | A1 * | 4/2010 | Larson-Kolomyjec | F22B 37/008 340/627 |
| 2011/0068053 | A1 * | 3/2011 | Kim | B01D 46/0086 210/92 |
| 2016/0061747 | A1 * | 3/2016 | Lee | G01N 21/94 356/73 |
| 2016/0121251 | A1 * | 5/2016 | Baek | F24F 3/1603 95/25 |

FOREIGN PATENT DOCUMENTS

| | | |
|---|---|---|
| DE | 10 2012 005381 A1 | 9/2013 |
| DE | 102012005381 A1 * | 9/2013 |
| JP | H04 200707 A | 7/1992 |
| JP | 2012 199499 A | 10/2012 |
| WO | 2008/032339 A1 | 3/2008 |
| WO | 2016/078661 A1 | 5/2016 |

* cited by examiner

SYSTEM AND METHOD FOR DETECTING A LEVEL OF DIRTINESS OF A FILTER MAT OF AN AIRFLOW COOLING SYSTEM FOR TELECOMMUNICATIONS EQUIPMENT

RELATED APPLICATIONS

This application is a 35 U.S.C. 371 national stage filing of International Application No. PCT/EP2017/063370, filed on Jun. 1, 2017, which claims priority to European Patent Application No. 16174335.6, filed on Jun. 14, 2016. The entire contents of these applications are incorporated herein by reference in their entirety.

FIELD OF THE INVENTION

The present invention is in the field of telecommunications equipment. In particular, the present invention relates to the detection of the amount of dirt accumulated in a filter mat of an airflow cooling system for telecommunications equipment.

BACKGROUND OF THE INVENTION

Telecommunications equipment produces during operation a significant amount of heat. Therefore, cooling systems are employed to avoid overheating and to keep the involved electrical components within their recommended temperature range of operation such that correct functioning thereof can be guaranteed.

Telecommunications equipment components are typically held in housing structures designed for such purposes, such as racks containing several subracks stapled on top of each other, in which components of equipment, such as cards, can be inserted and secured. An airflow cooling system may be employed to generate an airflow through the rack or subracks that dissipates away the excess heat produced by the telecommunications equipment installed therein. In that case, the air used for cooling has to be previously filtered in order to avoid that dirt suspended in the air is deposited on sensible components of the telecommunications equipment, such as printed circuit boards or sensors. Air filters are used for such purposes.

An air filter is a device typically composed of fibrous materials able to capture solid particles from the air flowing through it such that the airflow is substantially free from such solid particles once it has crossed the filter. In the course of operation of an airflow cooling system for telecommunications equipment, airborne solid particles such as dust, pollen, mould, and bacteria are captured by the filter and accumulate therein. Such solid particles are generally referred to herein as "dirt" or "dirtiness".

Eventually, the amount of dirt accumulated in the filter is such that the pore structure is occluded and airflow through it is reduced to an extent that proper dissipation of the heat generated by the telecommunications equipment can no longer be guaranteed. Therefore, air filters need to be replaced when such a situation occurs. It is hence useful to monitor the amount of dirt accumulated in the filter, such that the situation can be identified and the replacement of the filter can be initiated in due time.

Commonly known systems for detecting the level of dirtiness of an air filter generally make use of airflow sensors that measure the airflow through the filter or the subrack and signal a decrease thereof below a predefined threshold. However such airflow sensors are technically involved, highly sensible and very costly components. Thus there is room for technical improvements in the detection of the amount of dirt accumulated in a filter mat of an airflow cooling system for telecommunications equipment.

SUMMARY OF THE INVENTION

The problem underlying the invention is a need for a better solution for determing and addressing a level of dirtiness of a filter of an airflow cooling system for telecommunications equipment. This problem is solved by an apparatus, a system, and a method, according to the present invention.

The system of the invention comprises a detector for detecting fluorescent light or reflected light backscattered at at least one part of a filter mat, wherein the at least one part of the filter mat comprises or is treated with a fluorescent or a reflective material. The detector comprises a light source for illuminating with sampling light said at least one part of the filter mat and a photosensor for detecting fluorescent light or reflected light backscattered at said at least one part of the filter mat caused by the illumination thereof with sampling light. The system is further configured for inferring the level of dirtiness of the filter mat from the amount of detected fluorescent or reflected light.

Herein, a "fluorescent or reflective material" is understood to refer to any material able of backscattering electromagnetic radiation incident upon it, be it elastically (reflection) or inelastically (fluorescence) or of emitting electromagnetic radiation stimulated by said incident electromagnetic radiation. Fluorescence is a physical phenomenon wherein a material absorbs electromagnetic radiation incident upon it and emits thereupon fluorescent electromagnetic radiation. In most cases, the emitted radiation has a longer wavelength and thus lower photon energy than the absorbed radiation. This phenomenon is most widely known from materials absorbing light in the ultraviolet (UV) region of the spectrum and emitting light in the visible region of the spectrum. Thus, the incident radiation may be invisible for the human eye, while the emitted radiation may be visible. Herein, the term "light" shall refer to any kind of electromagnetic radiation without limitation to any wavelength range.

Backscattering is a physical effect wherein light incident on a surface is at least in part reflected back from the surface. In the narrower sense, the incident light is reflected back to the direction from which it came. Typically, it also refers to a diffuse reflection. Herein, terms like "backscattering" and "backscattered" are understood in a broad sense to refer to any kind of radiation emitted from a surface due to the incidence of radiation on this surface, irrespectively of whether the backscattered light has the same wavelength as the incident light (classical reflection) or the backscattered light has a wavelength different from that of the incident light (fluorescence). In particular, the term "backscattered light" refers herein to any kind of light propagating away from a surface or material regardless, for example, of whether incident light has been reflected or the backscattered light has been generated by fluorescence.

According to the invention, at least one part of the filter mat comprises or is treated with a fluorescent or reflective material, wherein a filter mat treated with a fluorescent or reflective material herein may in particular refer to a filter mat impregnated or coated with said fluorescent or reflective material. In the course of operation of an airflow cooling system for telecommunications equipment, the air used for cooling purposes is filtered by the filter mat such that dirtiness is captured thereby. Dirtiness accumulates in the parts of the filter mat exposed to airflow forming an external layer that covers the outer surfaces thereof and increasingly impedes the penetration of sampling light into the filter mat. Consequently, the amount of photons of the sampling light which are absorbed by dirt before reaching the surface of the filter mat increases with the amount of dirtiness accumulated in the filter mat and hence leads to a gradual decrease in the fluorescence and/or the reflectivity of the at least one part of the filter mat comprising or treated with fluorescent or reflective material.

Therefore, a measure of the amount of fluorescent light or reflected light backscattered by a filter mat comprising or treated with a fluorescent or reflective material can be interpreted as a measure of the level of dirtiness of the filter mat. For this purpose, the detector of the invention comprises a light source, typically an LED emitting in the UV part of the spectrum, and a photosensor, typically a photodiode, that measures the illuminance of the at least one part of the filter mat comprising or treated with fluorescent or reflective material. The photosensor accomplishes this by absorbing photons of the resulting fluorescent light or reflected light and generating a corresponding photocurrent. Since the photocurrent is proportional to the illuminance absorbed by the photodiode, a measure of the photocurrent provides a measure for the amount of dirt accumulated in the filter mat. The detectors of the invention are preferably placed on the side of the filter mat facing the incoming airflow.

The invention provides a system able of detecting a level of dirtiness of a filter mat of an airflow cooling system for telecommunications equipment such that the necessity of replacing the filter mat can be noticed at due time and the necessary replacement of the filter mat can be initiated. Since the system of the invention, other than previously known systems, does not rely on the use of expensive airflow sensors, a novel cost efficient manner of noticing the need of replacing a filter mat in an airflow cooling system for to the communications equipment is provided by the present invention.

In a preferred embodiment of the invention, the system further comprises a fluorescent or reflective material for treating said at least one part of the filter mat. This way, an existing filter mat may be treated, typically impregnated or coated, with the reflective or fluorescent material such that it becomes suitable for a system according to the invention to operate. For example, an existing filter mat may be impregnated with a fluorescent material such that upon installation of a system according to the invention, the level of dirtiness of the filter mat can be inferred.

According to preferred embodiments of the invention, the system further comprises a first additional detector for detecting fluorescent or reflected light backscattered at a part of the filter mat comprising or treated with a fluorescent or reflective material, wherein said part is not exposed to airflow during operation of said airflow cooling system. Thereby, a decrease in the amount of detected fluorescent or reflected light due to a natural timely decrease in the fluorescence or reflectivity of the fluorescent or reflective material can be properly accounted for. The intensity of the light backscattered by the fluorescent or reflective material might naturally decrease over time even without accumulation of dirt due to the fluorescent or reflective material not being sufficiently stable. A detector not exposed to airflow during operation of the airflow cooling system is not subject to a decrease in the amount of detected fluorescent or reflected light due to the accumulation of dirt in the filter mat. Hence by comparing the amount of fluorescent or reflected light detected by the detector to that detected by the first additional detector, a contribution to the decrease in the fluorescence or reflectivity of the fluorescent or reflective material not due to the accumulation of dust can be detected and properly taken into account so as to avoid a premature diagnose of the need to replace the filter mat.

In a preferred embodiment of the invention, the system further comprises a second additional detector for detecting the fluorescent or reflected light backscattered at a part of the filter mat not comprising or treated with the fluorescent or reflective material. Since the second additional detector is placed such that it detects the fluorescent or reflected light backscattered at a part of the filter mat not comprising or treated with the fluorescent or reflective material, any backscattered light detected by the photosensor of the second additional detector must be ambient light, that is, light other than fluorescent or reflective light caused by the illumination of said at least one part of the filter mat with sampling light. Hence the signal measured by the second additional detector can provide a measure of the impact of ambient light upon the amount of light detected by any detector, such that the contribution of such ambient light can be subtracted from the measurements of the detector and/or the first additional detector. Note that the term "second additional detector" is only chosen to distinguish it from the "first additional detector", but shall not rule out that such second additional detector is employed in embodiments without a "first additional detector".

Additionally or alternatively, a photosensor of at least one of said detector and additional detectors can be covered with a filter structure for filtering out said ambient light. Such filter structures might be used to suppress unwanted light in wavelengths ranges that do not correspond to the sampling light or that are excluded from the fluorescence mechanism. Further, at least one of said detector and additional detectors may be placed in an enclosure keeping away ambient light. This way, ambient light can be more efficiently suppressed so as to increase the accuracy of the detection of the level of dirtiness of the filter mat.

According to preferred embodiments of the invention, the sampling light is modulated with at least one predetermined frequency, wherein at least one of said detector and/or additional detectors is configured for filtering out or selectively amplifying a frequency component of the fluorescent or reflected light corresponding to said at least one predetermined frequency. Since the lifetime of fluorescence is relatively short, a timely modulation of the sampling light translates into a time dependence of the photocurrent measured by the photosensor that allows easily distinguishing the contribution to the photocurrent of the fluorescent or reflected light from that of ambient light. For these purposes, a lock-in amplifier technique may be used. It is also possible to use on-off keying digital modulation and to determine the extinction ratio, i.e. the ratio of the maximum photocurrent and the minimum photocurrent. This way, the contribution of ambient light to the signal measured by the detector can be accounted for so as to avoid a premature diagnosis of the need to replace the filter mat even without use of parts of the filter mat not comprising or not treated with the fluorescent or reflective material as a reference in the manner described above. Hence the filter mat may be completely treated with the fluorescent or reflective material. Further, no additional detectors are required for accounting for the contribution of ambient light. Other physical parameters may be modulated and used to distinguishing the contribution to the photocurrent of the fluorescent or reflected light from that of ambient light, like propagation direction and polarization.

In a preferred embodiment of the invention, the light source and the photosensor of at least one of said detector and/or additional detectors comprise a protected surface and are configured for being arranged with respect to a filter mat such that the protective surface is not directly exposed to airflow flowing through the filter mat during operation of the cooling system, wherein the sampling light is emitted from the protected surface of the light source and the fluorescent light or reflected light is detected at the protected surface of the photosensor. This way, the amount of dirt accumulating on the emitting or detecting surfaces of said detector and/or additional detectors and hence the influence thereof on the detection of the amount of fluorescent or reflected light is minimised. This is an advantageous effect inasmuch as the system of the invention aims at detecting the level of dirtiness of the filter mat and not of the components of detector. The extent to which said protected surfaces are protected from air flow may be influenced by the design of the detector. Preferably, the shape of the at least one of said detector and additional detectors might be such that the formation of turbulence in the airflow surrounding said detector and/or additional detector during operation of the cooling system is avoided. Thereby the deposition of dust on the light source and the photosensor due to turbulent air reflux can be prevented.

According to preferred embodiments of the invention, the system further comprises an impregnator for impregnating at least a part of the filter mat with the fluorescent or reflective material. Thereby, the filter mat or a portion thereof may be impregnated with the fluorescent or reflective material only immediately before said filter mat or portion thereof starts being employed for filtering purposes. This way, effects of the aforementioned limited durability of the fluorescent or reflective properties of the fluorescent of reflective material, possibly influenced by ambient conditions during manufacturing, transportation, or storage of the filter mat, can be minimised. Further, the system of the invention can directly be applied to an existing cooling system without the need to previously replace or treat the filter mat.

Additionally or alternatively, the fluorescent or reflective material can be in the form of a stripe or band configured for being attached to the filter mat. For instance, said stripe or band might be an adhesive band that can easily be adhered to the filter mat.

In a preferred embodiment of the invention, at least one part of the filter mat is provided with a characteristic pattern, wherein at least one of said detector and additional detectors or a dedicated detector is configured for detecting the characteristic pattern. By recognizing such a pattern, the presence of a proper dedicated filter mat comprising or treated with the fluorescent or reflective material may be confirmed, such that for example, the system can identify the insertion of an intended replacement filter mat after a filter mat has previously been removed. Further properties of the filter mat and/or of the fluorescent or reflective material may be encoded in the characteristic pattern, such that for instance, the properties of the sampling light and/or the operating conditions of any of the detectors can be adjusted accordingly.

A further aspect of the invention relates to a filtering device comprising a control unit, and a system according to any of the embodiments described above, wherein the control unit is operatively connected to at least one of said detector and additional detectors, and wherein the control unit is configured for inferring a level of dirtiness of the filter mat from the amount of detected fluorescent or reflected light. The filtering device preferably comprises a filter mat.

According to preferred embodiments of the invention, the filter mat comprises a filtering portion, which is exposed to airflow during operation of the cooling system, a usable portion, which can be used for filtering, and a used portion, which has previously been exposed to the airflow. The filter mat comprised in the filtering device is of a size, shape and extension such that, at a given time only a portion of it, referred to herein as the "filtering portion", is exposed to airflow and hence being used for filtering purposes. Preferably, the filtering device comprises a usable mat storage region and a used mat storage region, wherein the usable portion of the filter mat is stored in the usable mat storage region and the used portion of the filter mat is stored in the used mat storage region. Then, parts of the filter mat that have previously been used for filtering purposes and whose level of dirtiness is possibly such that they may no longer be used for such purposes, may be stored in the used mat storage region, whereas usable parts of the filter mat, which may still be used for filtering purposes, may be stored in the usable mat storage region.

The operation of replacing the entire filter mat needs not be carried out each time a part of the filter mat exposed to airflow needs replacing. Instead, once this happens, a part of the filter mat stored in the usable mat storage region may be conveyed into the filtering portion while the part of the filter mat previously situated in the filtering portion, which has now accumulated a substantial amount of dirt, can be conveyed into the used mat storage region.

Hence, replacement of the entire filter mat is only necessary after several such cycles, such that the operation lifetime of a single filter mat is maximised and the maintenance effort is minimized, which is particularly advantageous for telecommunications equipment at remote locations.

Preferably, the filtering device further comprises two roller cylinders, wherein the used and usable portions of the filter mat are respectively wound up on a respective one of the roller cylinders. Thereby, a simple and compact configuration for controlling the different portions of the filter mat and storing the same is provided. The roller cylinders may allow conveying a portion of the filter mat from the usable mat storage region into the part of the filtering device exposed to airflow, such that said portion may now constitute the filtering portion, while the part of the filter mat previously constituting the filtering portion may be conveyed into the used mat storage region by simply rotating the roller cylinders accordingly, such that a usable portion of the filter mat may unwind from the roller cylinder in the usable mat storage region and be conveyed into the filtering portion, while the part of the filter mat previously constituting the filtering portion may be conveyed into the used mat storage region and wound up on the roller cylinder in the used mat storage region.

Once the filter mat has been used up, i.e. all portions of the filter mat have accumulated an amount of dirt rendering them unsuitable for further filtering, most of the filter mat may be wound up on the roller cylinder in the used mat storage region, such that it may easily be replaced by extracting the filter mat that has already been used up and inserting a new filter mat by appropriately winding it on the rolling cylinders. The replacement of the filter mat may optionally include extracting and/or replacing at least part of the roller cylinders, for example an extractable part. Then, the filter mat may be provided by the manufacturer already totally or partially wound up on the roller cylinders, such that the filter mat can easily and quickly be replaced by replacing the roller cylinders it is wound up on.

Preferably, the filtering device may further comprise at least one driving mechanism for conveying the filter mat in a forward direction such that the portion thereof exposed to airflow during operation of the cooling system is changed. For instance, a portion of the filter mat may be conveyed from the filtering portion into the used mat storage region a portion thereof is moved from the usable mat storage region into the filtering portion. For example, the at least one driving mechanism may be configured for driving a rotation movement of one or both of the rolling cylinders when necessary. The at least one driving mechanism may also be integrated within one or both of the roller cylinders. Hence, when a portion of the filter mat in the filtering portion needs to be replaced, this might be done by operating the at least one driving mechanism, be it manually or preferably automatically under control of the control unit.

Advantageously, the at least one driving mechanism may allow for the automation of the process of conveying the filter mat in a forward direction, such that once the filtering portion of the filter mat has accumulated an amount of dirt rendering it at least partially unsuitable for further filtering, the filtering device may autonomously replace the portion of the filter mat constituting the filtering portion, such that the intervention of a human operator for supervising the filtering device is not required. Alternatively, the at least one driving mechanism may be configured for continuously conveying the filter mat in the forward direction such that the portion thereof constituting the filtering portion is continuously being renewed. In that case, the velocity with which the at least one driving mechanism conveys the filter mat in the forward direction may be conveniently adjusted, for instance such that a given portion of the filter mat remains within the filtering portion as long as the level of dirtiness accumulated therein does not render it at least partially unsuitable for filtering.

For example, the at least one driving mechanism may slow down the conveyance movement of the filter mat when a level of dirtiness that is below a first predefined threshold level is detected. Furthermore, the at least one driving mechanism may speed up the conveyance movement of the filter mat when a level of dirtiness that is above a second predefined threshold level is detected. In addition, the velocity of the at least one driving mechanism might be increased when a card in the subrack sends an alarm indicating that its temperature is above a specified operating temperature range. Such an alarm might also trigger a decrease of the second threshold level.

According to preferred embodiments of the invention, the detector is configured for detecting fluorescent or reflected light backscattered at a used portion of the filter mat and/or at the filtering portion thereof. Further, the first additional detector may be configured for detecting fluorescent or reflected light backscattered at a usable portion of the filter mat. Preferably, the detector and the first additional detector are respectively disposed such that the distance along the conveyance path of the filter mat between the first additional detector and the end of the filtering portion closest to the first additional detector is longer than the distance along the conveyance path of the filter mat between the detector and the end of the filtering portion closest to the detector. Most of the time, the detector measures fluorescent or reflected light at portions of the filter mat that have previously been exposed to the airflow, whereas the first additional detector measures fluorescent or reflected light at portions of the filter mat that have not been previously exposed to the airflow yet. However, the filter mat may be moved by a length equivalent to the distance between the detector and the end of the filtering portion closest to the detector, such that the detector can measure fluorescent or reflected light backscattered at the portion of the filter mat that is currently being used for filtering purposes as filtering portion. Once the measurement has been carried out, the filter mat can be moved back by the same length. Since the distance between the first additional detector and the end of the filtering portion closest to it is longer than said length, the measurements of the first additional detector are not disturbed by fluorescent or reflected light backscattered at the portion of the filter mat currently constituting the filtering portion.

According to a preferred embodiment of the invention, the sampling light is modulated with at least one predetermined frequency, and the control unit is further configured for filtering out or selectively amplifying a frequency component of the fluorescent or reflected light corresponding to said at least one predetermined frequency. This allows easily distinguishing the contribution to the photocurrent of the fluorescent or reflected light from that of ambient light. This way, the contribution of ambient light to the signal measured by the detector can be accounted for so as to avoid a premature diagnosis of the need to replace the filter. Other physical parameters may be modulated and used to distinguishing the contribution to the photocurrent of the fluorescent or reflected light from that of ambient light, like propagation direction and polarization.

In a preferred embodiment of the invention, the control unit is further configured for detecting when the level of dirtiness exceeds a predefined dirtiness threshold. Any configurations of the filtering device related to the replacement of a used filter mat can then be referred to this dirtiness threshold. Preferably, the control unit is further configured for providing a warning signal for signalling the necessity of replacing the filter mat or the portion thereof exposed to airflow when the control unit detects that the level of dirtiness has exceeded the predefined dirtiness threshold. The warning signal may then be appropriately interpreted by a human supervisor or by the control unit itself such that the required action for replacing said filter mat or portion thereof exposed to airflow be initiated. For example, the control unit may be operatively connected to the at least one driving mechanism described above, wherein when the control unit detects that the level of dirtiness has exceeded the predefined dirtiness threshold, the control unit operates the at least one driving mechanism in order that a portion of the filter mat is conveyed in the forward direction, such that the portion of the filter mat exposed to airflow during operation of the cooling system is changed. This renders human supervision of the filtering device unnecessary until an entire filter mat needs to be replaced.

According to preferred embodiments of the invention, the filtering device further comprises an electrical contact for operatively connecting the filtering device to a housing for holding said telecommunications equipment when the filtering device is disposed into the housing. The housing in the sense of this invention is typically formed by a rack for holding telecommunications equipment. Preferably, the filtering device is a pluggable filtering device configured for being plugged into a housing for holding telecommunications equipment. Said housing is preferably a rack or a subrack for holding telecommunications equipment. Thereby, an operative connection between the housing and the filtering device can be established in spite of the filtering device being a replaceable device. For instance, the filtering device, or parts thereof, like the filter mat, may be replaced or extracted for carrying out maintenance tasks. Once a filtering device is disposed in the housing again, the operative connection between the housing and the filtering device is guaranteed by said electrical contact. This allows, for example, a recycling configuration according to which the filtering device might be extracted, the filter mat thereof replaced, and then the filtering device might be inserted back into the housing and operation is resumed. Alternatively, the filtering device as a whole may be replaced once the filter mat thereof needs replacing.

According to preferred embodiments of the invention, the control unit is further configured for storing an initial value of the amount of fluorescent or reflected light detected by at least one of said detector and additional detectors. A usable portion of the filter mat is a portion that has not been previously exposed to the airflow during operation of the cooling system to an extent rendering said portion of the filter mat at least partially unsuitable for filtering purposes. For example, said initial value may be stored when starting operation of the cooling system with a previously unused filter mat or previously unused portion thereof. The control unit may then be further configured for comparing said initial value with the current value of said amount of detected fluorescent or reflected light in order to detect a change in said amount of detected fluorescent or reflected light with respect to said initial value. Preferably, the control unit is further configured for storing a new value of said initial value when the filter mat or the portion thereof exposed to airflow during operation of the cooling system is changed and when a significant increase in the current value of said amount of detected fluorescent or reflected light is detected. Thereby, the control unit can recognise if the filter mat has been removed and/or replaced and/or whether the detector and/or additional detectors have been cleaned. For instance, irrespectively of whether the detector and/or additional detectors have been cleaned, a new initial value is stored when the filter mat is replaced such that a corresponding predefined dirtiness threshold can be updated with respect to the new initial value. This way, the possibility that dust accumulated on detectors triggers a premature diagnose of the necessity of replacing the filter mat can be avoided.

Further, in case the filtering device is for instance removed from the housing, for example to carry out control or maintenance tasks, and inserted again to continue operation without having replaced the filter mat, the control unit will detect that the filter mat has been replaced but since no significant increase in the amount of detected fluorescent or reflected light is detected, no new initial value is stored such that operation of the filtering device may be resumed unaffected by the extraction and subsequent reinsertion of the filtering device.

A further aspect of the invention refers to a subrack for holding telecommunications equipment configured for receiving the filtering device described above, characterised in that the subrack comprises an electrical contact for operatively connecting a filtering device to the subrack when the filtering device is disposed in the subrack. Preferably, the subrack further comprises cleaning means disposed such that when the filtering device is inserted to or extracted from the subrack, the detectors of the system of the filtering device are cleaned by the cleaning means, such that dirt deposited on the detectors is cleaned away. This way, the dirt deposited on the detectors, that could possibly disturb the measurement of the detected fluorescent or reflected light, is automatically cleaned away each time the filtering device is inserted to or extracted from the subrack, for example for replacing the filter mat. Advantageously this makes a correct functioning of the filtering device independent of whether a human operator manually removes dust accumulated on the detectors or not. For example, the cleaning means may comprise a brush disposed such that when the filtering device is inserted to or extracted from the subrack, the detectors of the system of the filtering device are brushed by the brush, such that dirt deposited on the detectors is brushed away A further aspect of the invention refers to a method for inferring a level of dirtiness of a filter mat from the amount of detected fluorescent or reflected light backscattered at at least one part of the filter mat with any of the systems and/or filtering devices described above.

DESCRIPTION OF THE PREFERRED EMBODIMENTS

Figure 1:
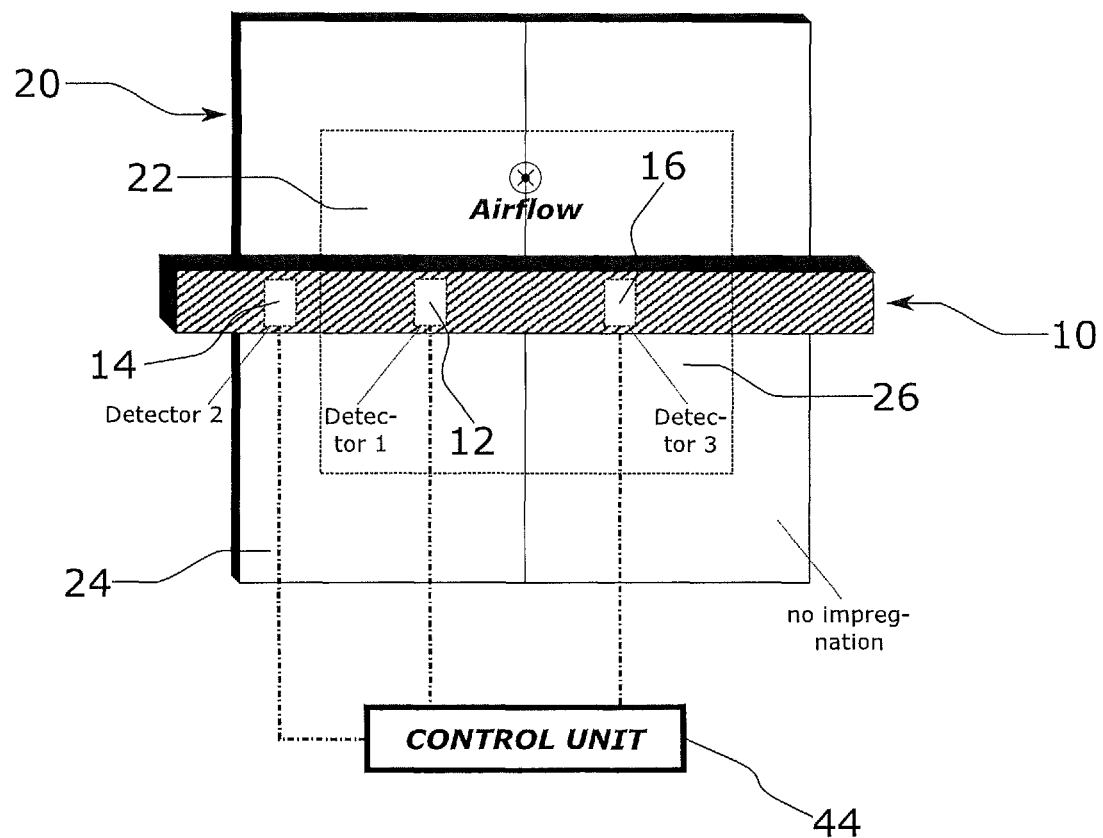
FIG. 1 Shows a system according to an embodiment of the invention.

For the purposes of promoting an understanding of the principles of the invention, reference will now be made to a preferred embodiment illustrated in the drawings, and specific language will be used to describe the same. It will nevertheless be understood that no limitation of the scope of the invention is thereby intended, such alterations and further modifications in the illustrated apparatus and such further applications of the principles of the invention as illustrated therein being contemplated as would normally occur now or in the future to one skilled in the art to which the invention relates.

FIG. 1 shows a system 10 for detecting a level of dirtiness of a filter mat 20 of an airflow cooling system for telecommunications equipment according to an embodiment of the invention. The system 10 comprises a detector 12 for detecting fluorescent light emitted due to incident UV light at at least one part 22 of the filter mat 20 impregnated with a fluorescent material. The system 10 further comprises a first additional detector 14 for detecting fluorescent light backscattered at a part 24 of the filter mat 20 impregnated with the fluorescent material, wherein said part 24 is not exposed to airflow during operation of the airflow cooling system. Further, the system 10 comprises a second additional detector 16 for detecting light backscattered at a part 26 of the filter mat 20 which is not impregnated with the fluorescent material. The detector 12, the first additional detector 14, and a second additional detector 16 comprise a light source (not shown) for illuminating the corresponding parts 22, 24, or 26 of the filter mat 20 with sampling light and a photosensor for detecting fluorescent light backscattered at said parts 22, 24, 26 of the filter mat 20 caused by the illumination thereof with sampling light. The light sources of the detectors 12, 14, and 16 are LEDs emitting in the UV part of the spectrum. The photosensors of the detectors 12, 14, and 16 are photodiodes that absorb photons of the resulting fluorescent light and generate a corresponding photocurrent.

The system 10 is configured for inferring the level of dirtiness of the filter mat 20 from the amount of detected fluorescent light detected by the detectors 12, 14, and 16, a measure of which is provided by the photocurrent generated by the photodiodes thereof. For that purpose, the detector 12, the first additional detector 14 and the second additional detector 16 are connected to a control unit 44. The control unit 44 processes the photocurrents generated by the detectors 12, 14, and 16 and infers the level of dirtiness of the filter mat 20. Since the first additional detector 14 detects fluorescent light backscattered at a part 24 of the filter mat 20 impregnated with the fluorescent material but not exposed to airflow, the first additional detector 14 provides a measure of the timely evolution of the fluorescence of the fluorescent material over time that is not influenced by the accumulation of dirt. Further, the second additional detector 16 detects the fluorescent light backscattered at a part 26 of the filter mat 20 that is exposed to airflow but has not been impregnated with the fluorescent material. Hence, any backscattered light detected by the photodiode of the second additional detector 16 must be ambient light, that is, light other than fluorescent light caused by the illumination of said part 26 of the filter mat 20 with sampling light. Thus, the amount of backscattered light measured by the first additional detector 14 and by the second additional detector 16 may be taken into account when evaluating the amount of fluorescent light measured by the detector 12 such that the contributions of ambient light and of a possible natural timely decrease of the fluorescence properties of the fluorescent material can be subtracted from the signal measured by the detector 12. This way, the system 10 is able to infer the level of dirtiness accumulated in the filter mat 20 in spite of the effects of ambient light and of an eventual timely deterioration of the fluorescence properties of the fluorescent material.

Figure 2:
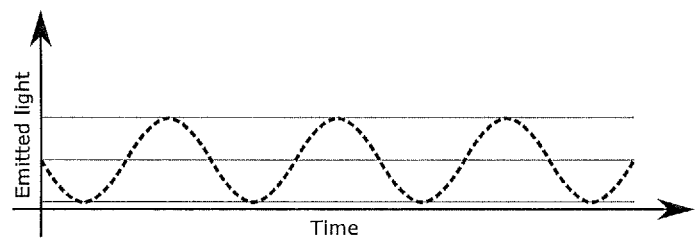
FIG. 2 Illustrates how modulation of the sampling light may help eliminating the impact of ambient light:
   a. illustrates sinusoidal modulation of the sampling light;
   b. illustrates on-off keying-based digital modulation of the sampling light.
Figure 2:
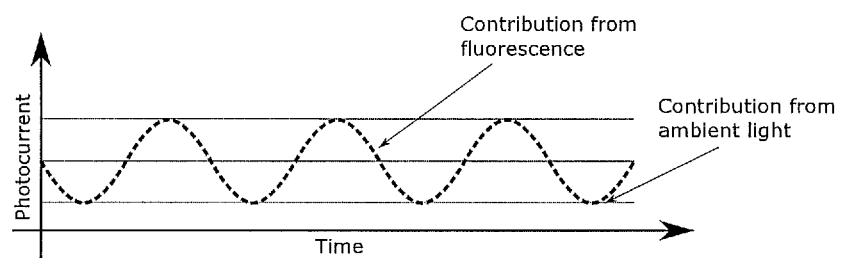
Figure 2:
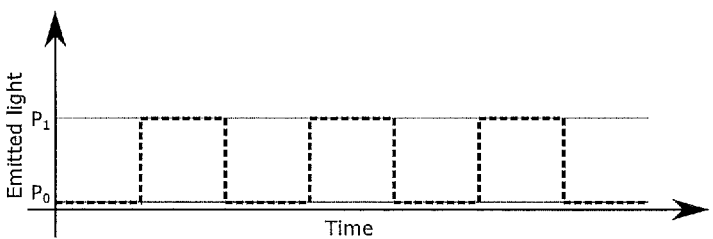
Figure 2:
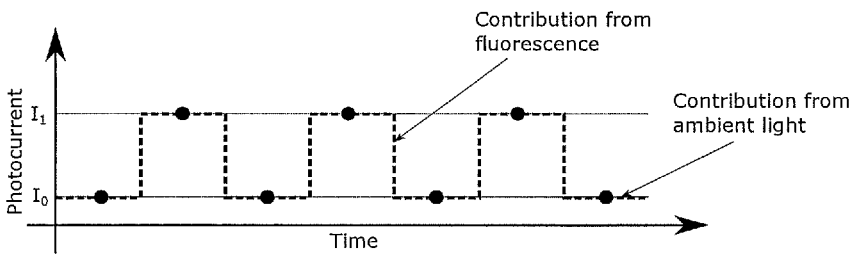

The presence of the second additional detector 16 can be rendered unnecessary in some embodiments of the invention by covering the photosensors of the detector 12 and of the first additional detector 14 with a filter structure for filtering out ambient light. Additionally or alternatively, the sampling light of the detectors 12 and 14 can be modulated as shown in FIG. 2. Modulation with at least one predetermined frequency is shown in FIG. 2a, which illustrates sinusoidally modulated sampling light in the upper row and the corresponding detected photocurrent in the lower row. As opposed to sampling light, ambient light is not modulated, so the contribution to the detected backscattered light not corresponding to fluorescent light can be easily subtracted by configuring the detectors 12 and 14 to filter away the signal components not corresponding to the predetermined frequency of modulation. In an alternative embodiment, the modulated signal can be amplified as compared to any background signal due to ambient light by lock-in amplification in a manner per se known in the art.

Emitted optical power of the sampling light and the resulting photocurrent when using a digital modulation signal based on on-off-keying (OOK) are illustrated in FIG. 2b. The optical power of the sampling light alternatingly takes two values, namely a maximum value $P_1$ and a minimum value $P_0$. The modulation signal is characterized by the extinction ratio $\varepsilon_{source} = P_1/P_0$, which typically amounts to around 13 dB. The photocurrent values corresponding to these power levels are denoted by $I_1$ and $I_0$, respectively. Assuming a linear relationship between the photocurrent and the optical power incident on the surface of the photodiode and denoting the extinction ratio of the photocurrent by $\varepsilon_{current} = I_1/I_0$, the contribution $I_{mod}$ of the modulation signal to the average photocurrent $\bar{I}$ is given by the equation $$\frac{I_{mod}}{\bar{I}} = \frac{(\varepsilon_{source}+1)(\varepsilon_{current}-1)}{(\varepsilon_{source}-1)(\varepsilon_{current}+1)}.$$

Thus, the contribution of ambient light to the overall detected photocurrent can be removed by measuring the extinction of the photocurrent, since the extinction of the modulation signal is typically known.

Figure 3:
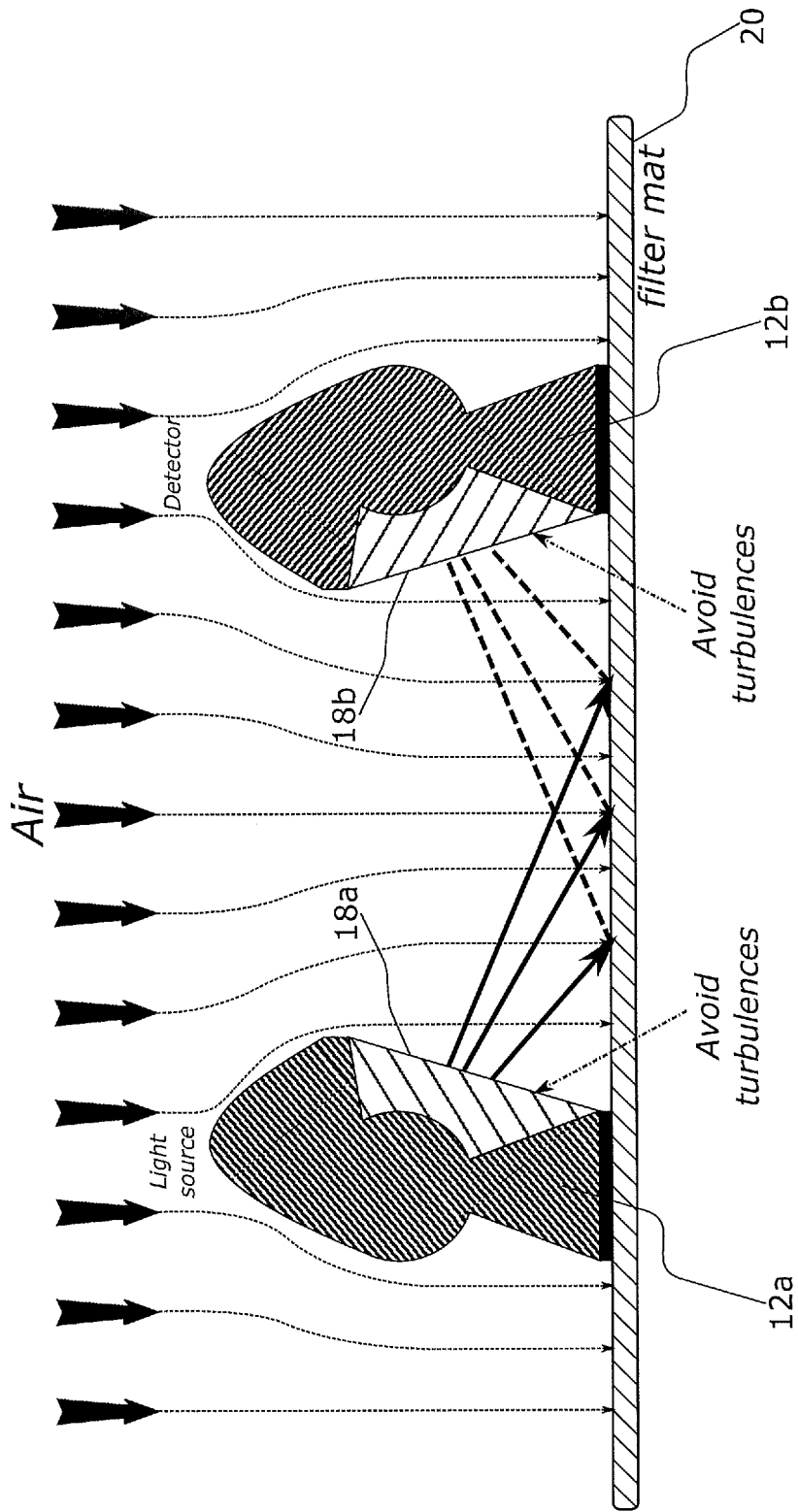
FIG. 3 Shows an exemplary design of a detector according to embodiments of the invention.

FIG. 3 shows a preferred embodiment of the detectors 12, 14 and 16 of FIG. 1. As illustrated therein, each detector comprises a light source 12a and a photosensor 12b. The light source 12a and the photosensor 12b each comprise a protected surface 18a and 18b. When arranged with respect to the filter mat 20 in the way shown in the figure, the protected surfaces 18a and 18b are substantially parallel or slightly tilted with respect to the airflow during operation of the cooling system and hence not directly exposed thereto, such that no dirt accumulates on the protected surfaces 18a and 18b. The sampling light is emitted by the light source 12a from its protected surface 18a and the resulting fluorescent light is detected by the photosensor 12b at its protected surface 18b. Further, the shape of the detector shown in the figure, i.e. of the light source 12a and of the photosensor 12b, is such that the formation of turbulence in the airflow surrounding the light source 12a and the photosensor 12b is avoided, as indicated by the arrows and lines signalling the airflow. Thereby, the deposition of dust on the protected surface 18a of the light source 12a and on the protected surface 18b of the photosensor 12b due to turbulent air reflux is prevented.

Figure 4:
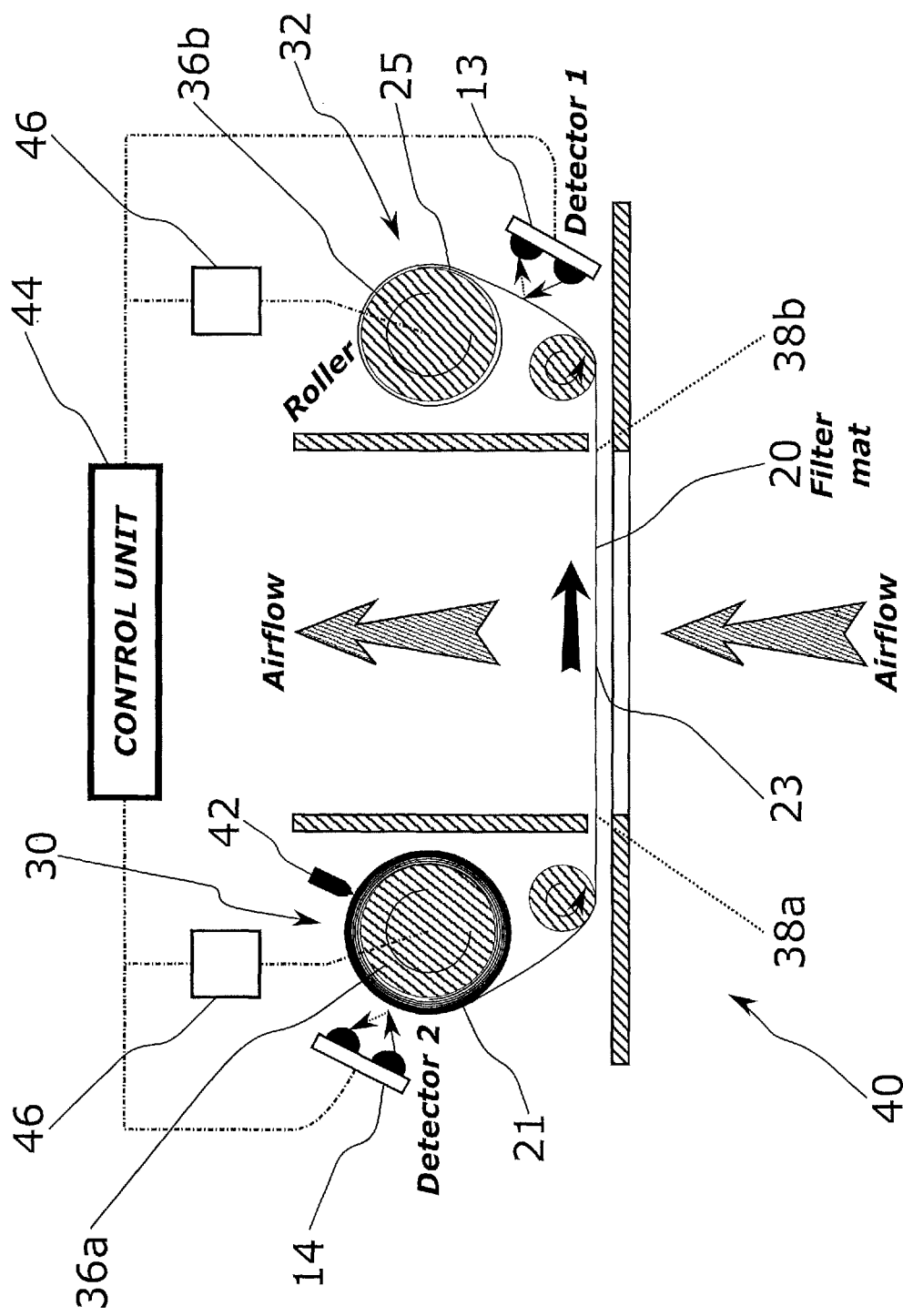
FIG. 4 Shows an embodiment of a filtering device comprising two roller cylinders.

FIG. 4 shows a filtering device 40 comprising a control unit 44, two driving mechanisms 46, a filter mat 20 and a system for detecting a level of dirtiness of the filter mat 20 of an airflow cooling system for telecommunications equipment equivalent to the system shown in FIG. 1. The filtering device 40 comprises a filtering portion 23 of the filter mat 20 exposed to the airflow during operation of the cooling system, a usable mat storage region 30 for storing usable portions 21 of the filter mat 20, and a used mat storage region 32 for storing used portions 25 of the filter mat 20, wherein said used portions 25 have previously been exposed to the airflow. The filtering device 40 further comprises two roller cylinders 36a and 36b. In the embodiment shown, the driving mechanisms 46 are each operatively connected to one of the roller cylinders 36a and 36b and configured for driving a rotation movement thereof. However, it is also possible that a driving mechanism be operatively connected to one or both of the roller cylinders 36a, 36b and that it be integrated within one or both of the roller cylinders 36a, 36b or attached to them.

The used portion 25 of the filter mat 20 is wound up on the roller cylinder 36b and the usable portion 21 of the filter mat 20 is wound up on the roller cylinder 36a. By rotating the roller cylinders 36a and 36b, a part of the filter mat 20 can be conveyed from the usable mat storage region 30 into the region of the filtering device 40 exposed to airflow such that said part of the filter mat 20 now constitutes the filtering portion 23 thereof, exposed to airflow, whereas the part of the filter mat 20 previously constituting the filtering portion 23 thereof is conveyed into the used mat storage region 32.

As illustrated in the figure, the rotation of the roller cylinders 36a and 36b as indicated by the curved arrows leads to a displacement of the filter mat 20 in the forward direction signalled by the black arrow that causes a usable portion 21 of the filter mat 22 to unwind from the roller cylinder 36a in the usable mat storage region 30 and to be conveyed into the part of the filtering device 40 exposed to airflow such that it now constitutes the filtering portion 23. Meanwhile, the portion of the filter mat 20 previously constituting the filtering portion 23 is conveyed into the used mat storage region 32 and wound up on the roller cylinder 36b. The filtering device 40 further comprises an impregnator 42 for impregnating the filter mat 20 while it unwinds from the roller cylinder 36a when the roller cylinders 36a and 36b rotate. The impregnator 42 is placed before the additional detector 14 along the conveyance path of the filter mat 20, such that the parts of the filter mat 20 reaching the position of the additional detector 14 have already been impregnated with the fluorescent material by the impregnator 42. The rotation of the roller cylinders 36a and 36b is driven by the driving mechanisms 46, which are controlled by the control unit 44.

By way of example, FIG. 4 shows a configuration in which two driving mechanisms 46 respectively drive one of the roller cylinders 36a and 36b. Of course, the driving mechanisms 46 can be integrated in a single device. Configurations in which a driving mechanism drives only one of the roller cylinders are also possible. The convenience of a given configuration of the driving mechanism 46 depends on the kind of conveyance movements of the filter mat 20 that have to be driven. For example, a driving mechanism acting on the roller 36b can be sufficient for conveying the filter mat forward, i.e. in the direction signalled by the black arrow in the figure. However, means to actively rotate both rollers are typically required for conveying the filter mat back and forth. Note however, that the filter mat 20 can be conveyed back and forth even if only one of the roller cylinders 36a, 36b is directly driven by the driving mechanisms 46, for instance by means of additional means if necessary, such as a spring that executes force or torque on the roller cylinder not directly driven by the driving mechanisms 46. For example, a spring exerting a torque on roller 36a in a direction is opposite to the curved arrow shown in this roller in the figure can be used to convey the filter mat 20 backwards without directly applying any torque to roller 36b. A forwards conveyance movement in the direction indicated in the figure by the black arrow can be achieved by exerting a torque on the roller cylinder 36b by means of the driving mechanisms 46. Applying the same torque on both roller cylinders 36a, 36b would let the filter mat 20 rest in its current position.

The filtering device 40 further comprises a detector 13 configured for detecting fluorescent light backscattered at a part of the filter mat 20 momentarily stored in the used mat storage region 32 and a first additional detector 14 configured for detecting fluorescent light backscattered at a part of the filter mat 20 momentarily stored in the usable mat storage region 30. The detector 13 and the first additional detector 14 are disposed such that the length of the filter mat 20 along the conveyance path thereof between the detector 14 and the end 38a of the filtering portion 23 of the filter mat 20 closest to the first additional detector 14 is longer than the length of the filter mat 20 along the conveyance path thereof between the detector 13 and the end 38b of the filtering portion 23 of the filter mat 20 closest to the detector 13. Furthermore, as can be seen in the figure, the chosen position of the detectors 13 and 14 minimizes the amount of ambient light incident upon them.

The detector 13 measures most of the time fluorescent light backscattered at a used portion 25 of the filter mat 20 whereas the detector 14 measures most of the time fluorescent light backscattered at a usable portion 21 of the filter mat 20, which has not been exposed to airflow yet. However, it is possible for the driving mechanisms 46 to provisionally convey the filter mat 20 in the forward direction so that a part of the filtering portion 23 is moved forward into the used mat storage region in order that the detector 13 can detect fluorescent light backscattered at the portion of the filter mat 20 constituting the filtering portion 23. The filter mat is then conveyed in the forward direction by a length equivalent to the distance between the detector 13 and the end of the filtering portion 38b closest to the detector 13. Once the detection has been carried out, the driving mechanisms 46 conveys the filter mat 20 back to the initial position. Since the length of the filter mat 20 along the conveyance path thereof between the additional detector 14 and the end of the filtering portion 38a closest to it is longer than the length along the conveyance path of the filter mat 20 between the detector 13 and the end of the filtering portion 38b, the detection by the detector 14 is prevented from being disturbed by a detection corresponding to a part of the filter mat 20 which has provisionally been exposed to the airflow during the aforementioned measurement.

The control unit 44 is operatively connected to the detector 13 and to the first additional detector 14 and is configured for inferring the level of dirtiness of the filter mat 20 from the amount of detected fluorescent light detected by the detectors 13 and 14. Further, the control unit 44 is configured for detecting when the level of dirtiness in the filter mat 20 exceeds a predefined dirtiness threshold. When that happens, the control unit 44 of the filtering device 40 provides a warning signal that signals the necessity of replacing the filter mat 20 or the portion 23 thereof that is exposed to airflow. In that case, a human operator may replace the filter mat 20 or operate the driving mechanisms 46 such that the part of the filter mat constituting the filtering portion 23 is replaced by a part of the filter mat previously stored in the usable mat storage region 30. In the embodiment shown in FIG. 4, the control unit 44 is operatively connected to the driving mechanisms 46 and configured for automatically operating the driving mechanisms 46 when the control unit 44 detects that the level of dirtiness of the filter mat 20 has exceeded the predefined dirtiness threshold, in order that a portion of the filter mat 20 is conveyed in the forward direction, such that the portion of the filter mat 23 exposed to airflow under operation of the cooling system is replaced.

Figure 5:
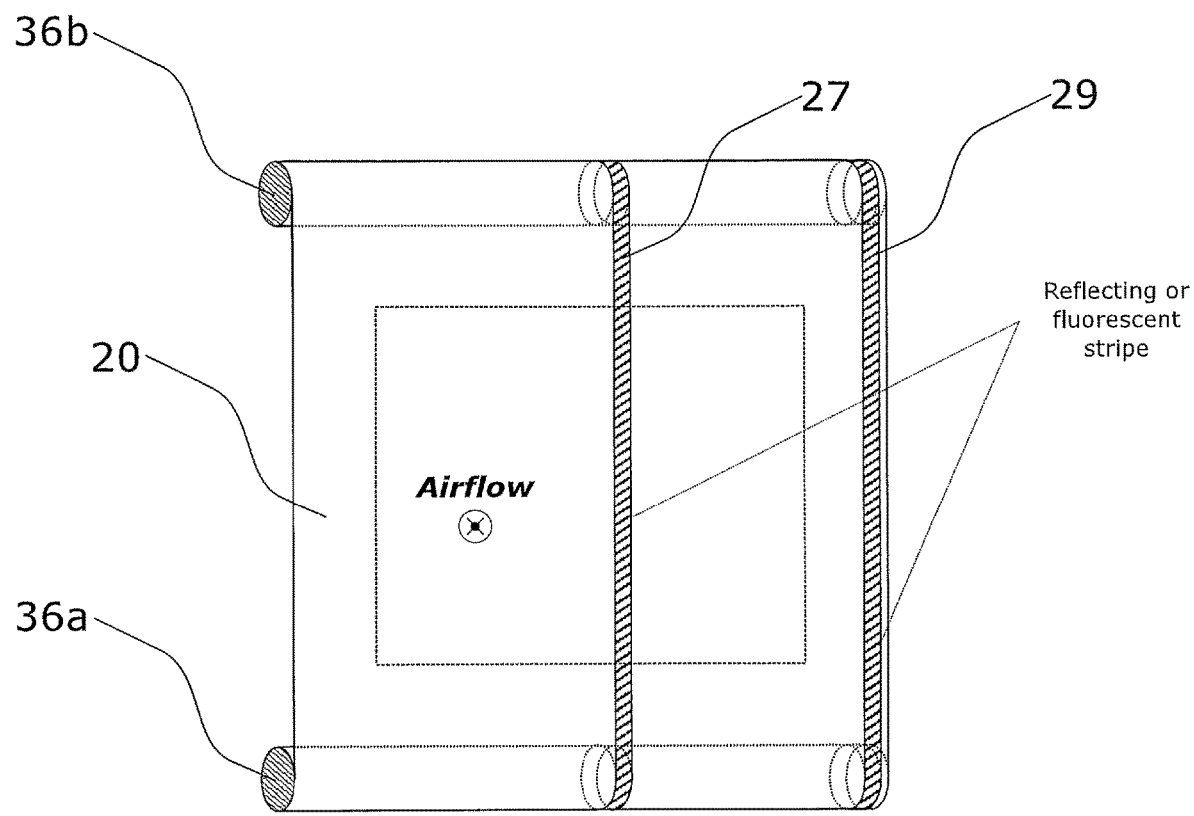
FIG. 5 Shows an embodiment of the invention using two roller cylinders and fluorescent stripes attached to the filter mat.

Another embodiment of the invention comprising rolling cylinders 36a and 36b is shown in FIG. 5. FIG. 5 shows a configuration in which the filter mat 20 is split in a usable portion, mostly corresponding to the part of the filter mat 20 wound up on the rolling cylinder 36a, a used portion, mostly corresponding to the part of the filter mat 20 wound up on the rolling cylinder 36b, and a filtering portion of the filter mat 20 disposed between the usable portion and the used portion of the filter mat 20. The filter mat 20 comprises two stripes 27, 29 of fluorescent material, which are attached to the filter mat 20. The stripe 27 of fluorescent material is exposed to airflow such that light backscattered by the stripe 27 can be detected by a detector, e.g. the detector 12 of FIG.

1, to provide a measure of the level of dirtiness of the filter mat 20. The stripe 29 is not exposed to airflow so that light backscattered by the stripe 29 can be detected by a detector, e.g. the detector 14 of FIG. 1, to provide a measure of a natural deterioration of the fluorescence properties of the fluorescent material to be accounted for by properly interpreting the measurement corresponding to the stripe 27.

Figure 6:
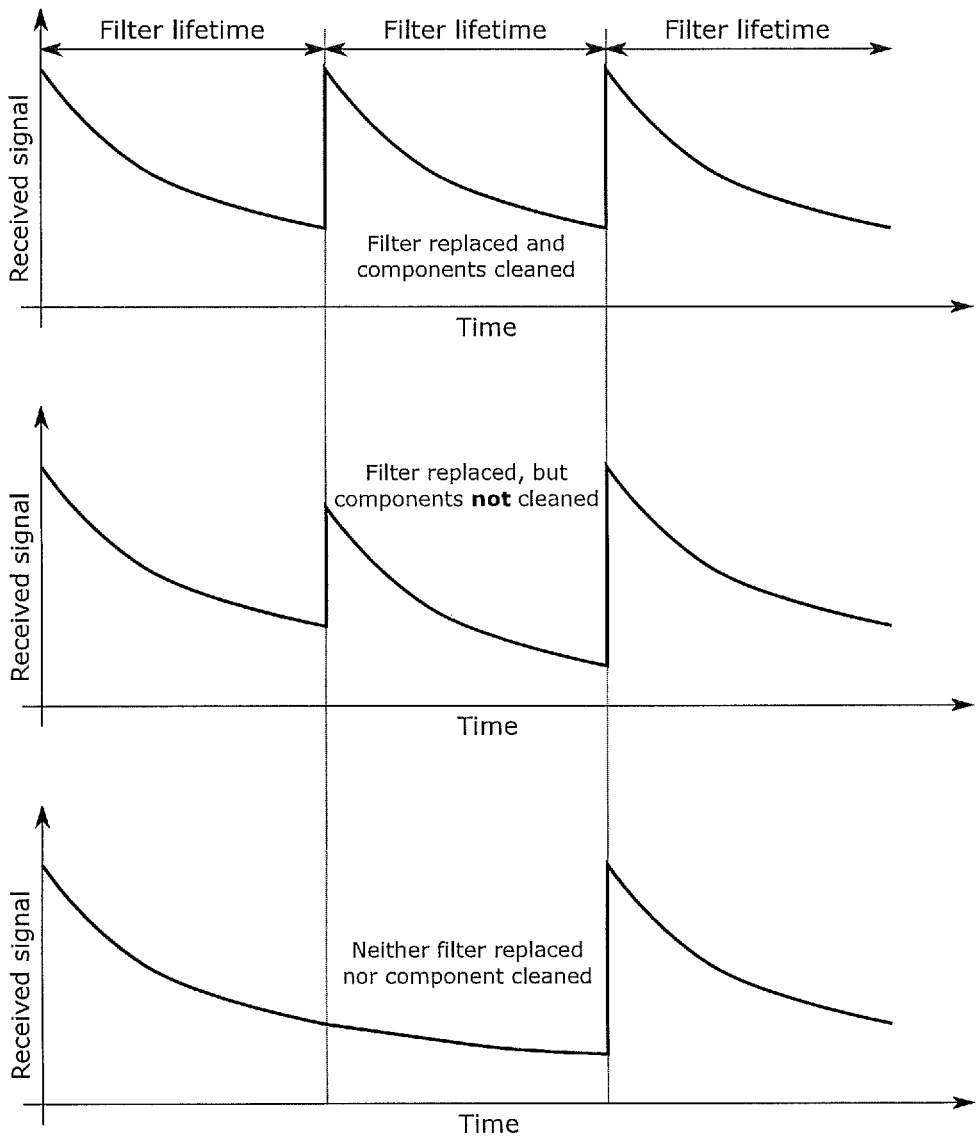
FIG. 6 Illustrates the comparison of the current amount of detected fluorescent or reflected light to an initial value.

The control unit 44 of of FIG. 1 is configured for storing an initial value of the amount of fluorescent light detected by the detector 12, that is of the amount of fluorescent light backscattered at the part 22 of the filter mat 20 impregnated with the fluorescent material. This initial value corresponds to the first maximum peak shown in the plots of FIG. 6. The control unit 44 is configured for comparing the current value of the amount of detected fluorescent light detected by the detector 12 of FIG. 1, in order to detect a change in the value of said amount of fluorescent light. As shown in the figure, the control unit 44 is further configured for storing a new value of said initial value when the filter mat 20 or the portion thereof 22 exposed to airflow is replaced and a significant increase in the current amount of detected fluorescent light is detected. The situations in which the necessity of replacing the filter mat 20 (or the portion thereof 22 exposed to airflow) is signalled by the control unit 44 are marked by vertical lines in the figure. The plot in the upper row shows the ideal scenario in which, upon replacement of the filter mat 20, the corresponding detectors of the system 10 are free of dust or properly cleaned. Then, the current amount of detected fluorescent light reaches the initial value upon replacement of the filter mat 20. The middle row of the figure displays the situation in which, when the control unit 44 first signals the necessity of replacing the filter mat 20, the filter mat 20 is replaced but the corresponding detectors are not properly cleaned. Therefore, any dust covering the detectors provokes the amount of detected fluorescent light to be initially below the initial level, as shown in the figure. However, since a new initial value is then stored and the current amount of detected fluorescent light is from then on compared to the newly stored initial value, the failure to clean the corresponding detectors does not result in a subsequent premature signalling of the necessity of replacing the filter mat 20 or the portion thereof exposed to airflow, as displayed in the figure. The lower row of the plot shows the situation in which the filter mat 20 is temporarily removed, for example to carry out maintenance tasks, but not replaced. Instead, the same filter mat 20 which has been removed is inserted back to continue operation and hence no significant increase in the current amount of detected fluorescent light is detected. The control unit 44 recognises that situation and does not store a new initial value. This only happens in the second of the shown vertical markings, which corresponds to a replacement of the filter mat 20.

Figure 7:
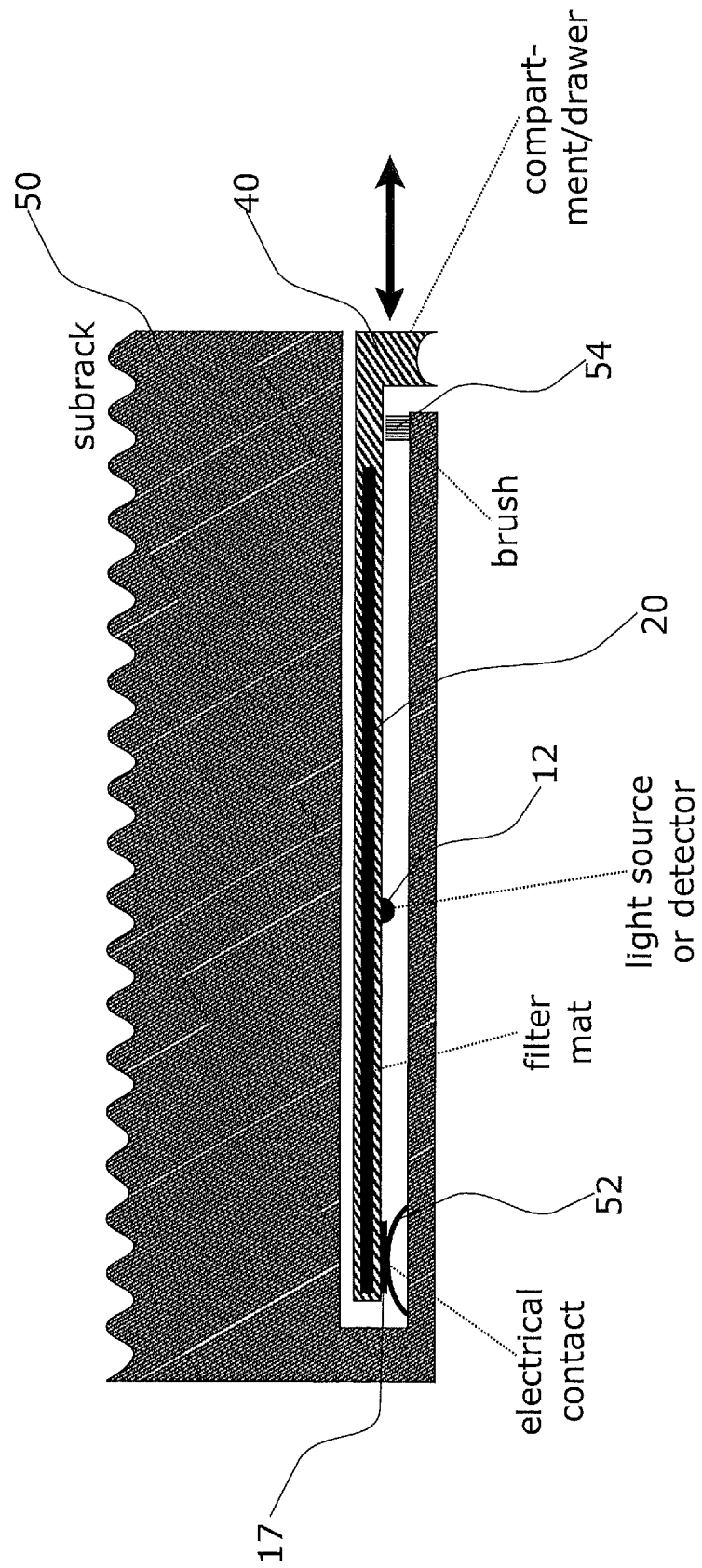
FIG. 7 Shows a subrack and a filtering system disposed within the subrack according to an embodiment of the invention.

FIG. 7 schematically shows a subrack 50 of a rack for holding telecommunication equipment configured for receiving a pluggable filtering device 40. The pluggable filtering device 40 comprises a filter mat 20, a detector 12 and an electrical contact 17 for operatively connecting the pluggable filtering device 40 to the subrack electrical contact 52 of the subrack 50 when the pluggable filtering device 40 is disposed in the subrack 50 as shown in the figure. The subrack 50 further comprises a brush 54 disposed such that when the pluggable filtering device 40 is inserted or extracted from the subrack 50, the detector 12 of the pluggable filtering device 40 is brushed by the brush 54, such that any dirt deposited on the detector 12 is brushed away. The configuration shown in FIG. 7 allows for the pluggable filtering device 40 to be sold as a complete plug-in unit comprising a low-cost detector 12 and a low-cost filter mat 20. Additionally or alternatively, the filter mat 20 of the pluggable filtering device 40 may be replaceable. The replacement of the filter mat 20 of the pluggable filtering device 40 is eased by the drawer configuration shown in the figure, which allows for the insertion and removal of the pluggable filtering device 40 into and from the subrack 50 in an easy manner.

Although preferred exemplary embodiments are shown and specified in detail in the drawings and the preceding specification, these should be viewed as purely exemplary and not as limiting the invention. It is noted in this regard that only the preferred exemplary embodiments are shown and specified, and all variations and modifications should be protected that presently or in the future lie within the scope of protection of the invention as defined in the claims.

REFERENCE SIGN LIST

10 system
12, 13 detector
12a light source
12b photosensor
14, 16 additional detector
17 electrical contact
18a, 18b protected surfaces of detector
20 filter mat
21 usable portion of filter mat
22 part of filter mat comprising or treated with a fluorescent or reflective material and exposed to airflow
23 filtering portion of filter mat
24 part of filter mat comprising or treated with a fluorescent or reflective material and not exposed to airflow
25 used portion of filter mat
26 part of filter mat not comprising or treated with a fluorescent or reflective material and exposed to airflow
27 stripe of fluorescent material exposed to airflow
29 stripe of fluorescent material not exposed to airflow
30 usable mat storage region
32 used mat storage region
36a, 36b roller cylinders
38a, 38b ends of the filtering portion of the filter mat
40 filtering device
42 impregnator
44 control unit
46 driving mechanisms
50 subrack
52 electrical contact of subrack
54 brush

The invention claimed is:
1. A system for detecting a level of dirtiness of a filter mat of an airflow cooling system for telecommunications equipment, the system comprising:
    a detector for detecting fluorescent or reflected light backscattered at a first part of the filter mat comprising or treated with a fluorescent or reflective material, wherein the detector comprises:
        a light source for illuminating the first part of the filter mat with sampling light; and
        a photosensor for detecting fluorescent or reflected light backscattered at the first part of the filter mat caused by the illumination thereof with sampling light;
    a first additional detector for detecting fluorescent or reflected light backscattered at a second part of the filter mat comprising or treated with a fluorescent or reflec- tive material, wherein the second part is not exposed to an airflow during operation of the airflow cooling system; and wherein the system is configured for inferring the level of dirtiness of the filter mat from an amount of detected fluorescent or reflected light.

2. The system of claim 1, further comprising a second additional detector for detecting fluorescent or reflected light backscattered at a third part of the filter mat not comprising or treated with the fluorescent or reflective material.

3. The system of claim 2, wherein a photosensor of at least one of the detector and the additional detectors is covered with a filter structure for filtering out ambient light, wherein ambient light is light other than the fluorescent or the reflective light.

4. The system of claim 2, wherein the light source and the photosensor of at least one of the detector and the additional detectors each comprise a protected surface and is configured for being arranged with respect to the filter mat such that the protected surface is not directly exposed to the airflow flowing through the filter mat during operation of the airflow cooling system, wherein the sampling light is emitted from the protected surface of the light source and the fluorescent or reflected light is detected at the protected surface of the photosensor.

5. The system of claim 4, wherein a shape of at least one of the detector and the additional detectors is such that a formation of turbulence in an airflow surrounding the respective detector or additional detector during operation of the airflow cooling system is avoided.

6. The system of claim 1, wherein the sampling light is modulated with at least one predetermined frequency, and wherein at least one of the detector and the additional detectors is configured for filtering out or selectively amplifying a frequency component of the fluorescent or reflected light corresponding to the at least one predetermined frequency.

7. The system of claim 1, further comprising an impregnator for impregnating at least a part of the filter mat with the fluorescent or reflective material.

8. The system of claim 1, wherein the fluorescent or reflective material is in a form of a stripe or band configured for being attached to the filter mat.

9. A filtering device for detecting a level of dirtiness of a filter mat of an airflow cooling system for telecommunications equipment, the filtering device comprising:
a control unit;
a detector for detecting fluorescent or reflected light backscattered at a first part of the filter mat comprising or treated with a fluorescent or reflective material, wherein the detector comprises:
a light source for illuminating the first part of the filter mat with sampling light; and
a photosensor for detecting fluorescent or reflected light backscattered at the first part of the filter mat caused by the illumination thereof with sampling light;
wherein the filter mat comprises:
a filtering portion, which is exposed to an airflow during operation of the airflow cooling system;
a usable portion, for filtering; and
a used portion, which has previously been exposed to the airflow;
wherein the control unit is operatively connected to at least one of the detector and the additional detectors, and wherein the control unit is configured for inferring a level of dirtiness of the filter mat from the amount of detected fluorescent or reflected light.

10. The filtering device of claim 9, further comprising a usable mat storage region and a used mat storage region, wherein the usable portion of the filter mat is stored in the usable mat storage region and the used portion of the filter mat is stored in the used mat storage region.

11. The filtering device of claim 9, further comprising a first roller cylinder and a second roller cylinder, wherein the used portion of the filter mat is wound up on the first roller cylinder and the usable portion of the filter mat is wound up on the second roller cylinder.

12. The filtering device of claim 9, further comprising at least one driving mechanism for conveying the filter mat in a forward direction such that a portion thereof exposed to the airflow during operation of the airflow cooling system is changed.

13. The filtering device of claim 12, wherein the control unit is operatively connected to the at least one driving mechanism, and wherein, when the control unit detects that the level of dirtiness has exceeded the predefined dirtiness threshold, the control unit operates the at least one driving mechanism such that a portion of the filter mat is conveyed in the forward direction, such that the portion of the filter mat exposed to the airflow during operation of the airflow cooling system is changed.

14. The filtering device of claim 9, wherein the detector is configured for detecting fluorescent or reflected light backscattered at at least one of the used portion and the filtering portion of the filter mat.

15. The filtering device of claim 14, wherein the detector and the first additional detector are respectively disposed such that a distance along a conveyance path of the filter mat between the first additional detector and an end of the filtering portion closest to the first additional detector is longer than a distance along the conveyance path of the filter mat between the detector and an end of the filtering portion closest to the detector.

16. The filtering device of claim 9, further comprising a first additional detector for detecting fluorescent or reflected light backscattered at a second part of the filter mat comprising or treated with a fluorescent or reflective material, wherein the second part is not exposed to the airflow during operation of the airflow cooling system, and wherein the first additional detector is configured for detecting fluorescent or reflected light backscattered at the usable portion of the filter mat.

17. The filtering device of claim 9, wherein the sampling light is modulated with at least one predetermined frequency, and wherein the control unit is further configured for filtering out or selectively amplifying a frequency component of the fluorescent or reflected light corresponding to the at least one predetermined frequency.

18. The filtering device of claim 9, wherein the control unit is further configured for detecting when the level of dirtiness exceeds a predefined dirtiness threshold.

19. The filtering device of claim 18, wherein the control unit is further configured for providing a control unit warning signal for signaling a necessity of replacing the filter mat or a portion thereof exposed to the airflow, when the control unit detects that the level of dirtiness has exceeded the predefined dirtiness threshold.

20. The filtering device of claim 9, further comprising an electrical contact for operatively connecting the filtering device to a housing when the filtering device is disposed into the housing.

21. The filtering device of claim 9, wherein the filtering device is a pluggable filtering device configured for being disposed into a housing for holding telecommunication equipment.

22. The filtering device of claim 9, wherein the control unit is further configured for storing an initial value of an amount of fluorescent or reflected light detected by at least one of the detector and the additional detectors.

23. The filtering device of claim 22, wherein the control unit is further configured for comparing a current value of the amount of detected fluorescent or reflected light with the initial value in order to detect a change in the amount of detected fluorescent or reflected light.

24. The filtering device of claim 22, wherein the control unit is further configured for storing a new value of the initial value when:
   the filter mat or the portion thereof exposed to the airflow is replaced; and
   a significant increase in a current value of the amount of detected fluorescent or reflected light that is detected.

* * * * *